United States Patent
Chen et al.

(10) Patent No.: US 10,418,390 B2
(45) Date of Patent: Sep. 17, 2019

(54) PIXEL ARRAY SUBSTRATE

(71) Applicant: E Ink Holdings Inc., Hsinchu (TW)

(72) Inventors: Yu-Wen Chen, Hsinchu (TW);
Kuo-Hsing Cheng, Hsinchu (TW);
Chun-Yu Lu, Hsinchu (TW); Yu-Chieh Hung, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/027,391

(22) Filed: Jul. 5, 2018

(65) Prior Publication Data
US 2019/0027510 A1    Jan. 24, 2019

(30) Foreign Application Priority Data
Jul. 21, 2017 (CN) .......................... 2017 1 0599757

(51) Int. Cl.
*H01L 27/12* (2006.01)
*H01L 23/485* (2006.01)

(52) U.S. Cl.
CPC ........ *H01L 27/1244* (2013.01); *H01L 23/485* (2013.01)

(58) Field of Classification Search
None
See application file for complete search history.

(56) References Cited

U.S. PATENT DOCUMENTS

| | | | |
|---|---|---|---|
| 5,729,309 A | 3/1998 | Na et al. | |
| 7,209,193 B2 | 4/2007 | Song et al. | |
| 8,081,282 B2 | 12/2011 | Lee et al. | |
| 8,754,999 B2 | 6/2014 | Lee et al. | |
| 8,760,479 B2 | 6/2014 | Shin et al. | |
| 10,096,627 B2 * | 10/2018 | Chen ..................... | H01L 27/124 |
| 2008/0246908 A1 | 10/2008 | Lee et al. | |

FOREIGN PATENT DOCUMENTS

| | | |
|---|---|---|
| TW | 201215979 | 4/2012 |
| TW | I396026 | 5/2013 |
| TW | I567468 | 1/2017 |

* cited by examiner

*Primary Examiner* — Evren Seven
(74) *Attorney, Agent, or Firm* — JCIPRNET (57) ABSTRACT

A pixel array substrate including a substrate, first signal lines, second signal lines, third signal lines, and active devices is provided. The first signal lines, the second signal lines, the third signal lines, and the active devices are disposed on the substrate. Each of the first signal lines has a jumper wire bridge structure which includes a first line and a second line disposed on the same film layer, and a third line disposed on another film layer. The second signal lines intersect the first signal lines and the third signal lines. Each of the second signal lines is electrically connected to one of the first signal lines. Each active device is electrically connected to one second signal line and one third signal line.

10 Claims, 7 Drawing Sheets

PIXEL ARRAY SUBSTRATE

CROSS-REFERENCE TO RELATED APPLICATION

This application claims the priority benefit of China application serial no. 201710599757.0, filed on Jul. 21, 2017. The entirety of the above-mentioned patent application is hereby incorporated by reference herein and made a part of this specification.

BACKGROUND OF THE INVENTION

Field of the Invention

The invention relates to a pixel array substrate, and more particularly relates to a pixel array substrate with a jumper wire bridge structure.

Description of Related Art

In order to reduce the width of the side frame of a display device, a circuit design has been proposed which employs a technique to connect horizontal signal lines to vertical selection lines and arrange the vertical selection lines in the display region. However, such a circuit design would result in a dense distribution of the vertical lines, and as a result, unnecessary short circuit or breakage may occur due to foreign matters in the manufacturing processes.

SUMMARY OF THE INVENTION

The invention provides a pixel array substrate with a selection line design that is conducive to reducing the possibility of an undesirable short circuit to prevent occurrence of line defects or abnormal screen.

A pixel array substrate of the invention includes a substrate, a plurality of first signal lines, a plurality of second signal lines, a plurality of third signal lines, and a plurality of active devices. The first signal lines, the second signal lines, the third signal lines, and the active devices are disposed on the substrate. The first signal line includes a jumper wire bridge structure. The jumper wire bridge structure includes a first line, a second line, and a third line, wherein the first line and the second line are located on the same film layer, and the third line is located on another film layer. Two ends of the second line are connected to the first line and the third line respectively. The second signal lines are electrically connected to different first signal lines respectively. The second line of the jumper wire bridge structure is located between adjacent two second signal lines, and the first line and the third line of the jumper wire bridge structure intersect the adjacent two second signal lines. The third signal lines intersect the second signal lines. Each of the active devices is electrically connected to one of the second signal lines and one of the third signal lines.

In an embodiment of the invention, the film layer of the first line and the third line of the jumper wire bridge structure is the same as a film layer of the third signal lines.

In an embodiment of the invention, the film layer of the second line of the jumper wire bridge structure is the same as a film layer of the second signal lines.

In an embodiment of the invention, the pixel array substrate further includes an insulating layer. The insulating layer is disposed between the film layer of the first line and the third line and the film layer of the second line, and the two ends of the second line are connected to the first line and the third line respectively via a first contact window and a second contact window that penetrate the insulating layer.

In an embodiment of the invention, the pixel array substrate further includes a plurality of pixel electrodes. Each of the active devices includes a gate, a channel layer, a source, and a drain. An area of the gate overlaps an area of the channel layer. The source and the drain are connected to the channel layer. One of the gate and the source is connected to one of the second signal lines and the other one of the gate and the source is connected to one of the third signal lines, and the drain is connected to one of the pixel electrodes.

In an embodiment of the invention, one of the third signal lines and one of the first signal lines are located on two sides of one of the pixel electrodes respectively.

In an embodiment of the invention, the second line of the jumper wire bridge structure of one of the first signal lines includes a central portion and two end portions located at two ends of the central portion, and a distance between the central portion and one of the third signal lines is greater than a distance between the two end portions and one of the third signal lines.

In an embodiment of the invention, one of the third signal lines is located between one of the first signal lines and one of the pixel electrodes.

In an embodiment of the invention, the pixel array substrate further includes a plurality of common electrodes, and an area of the common electrodes overlaps an area of the pixel electrodes.

In an embodiment of the invention, the pixel array substrate further includes a plurality of auxiliary electrodes. An area of the auxiliary electrodes overlaps an area of the common electrodes. Each of the common electrodes is located between one of the auxiliary electrodes and one of the pixel electrodes, and one of the auxiliary electrodes is electrically connected to the drain.

In an embodiment of the invention, the pixel array substrate further includes a plurality of common electrode connection lines. The common electrode connection lines connect the common electrodes, and one of the common electrode connection lines intersects the first line of one of the jumper wire bridge structures.

In an embodiment of the invention, the film layer of the first line and the third line is located between the film layer of the second line and the substrate.

In an embodiment of the invention, the first line, the second line, and the third line of the jumper wire bridge structure include the same material.

In an embodiment of the invention, an extension direction of the first signal lines and an extension direction of the third signal lines are parallel to each other.

Based on the above, in the pixel array structure of the invention, the first signal line uses the design of the jumper wire bridge to increase the spacing between adjacent lines on the same film layer, so as to prevent line defects or abnormal screen resulting from short circuit caused by foreign matters.

To make the aforementioned and other features and advantages of the invention more comprehensible, several embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
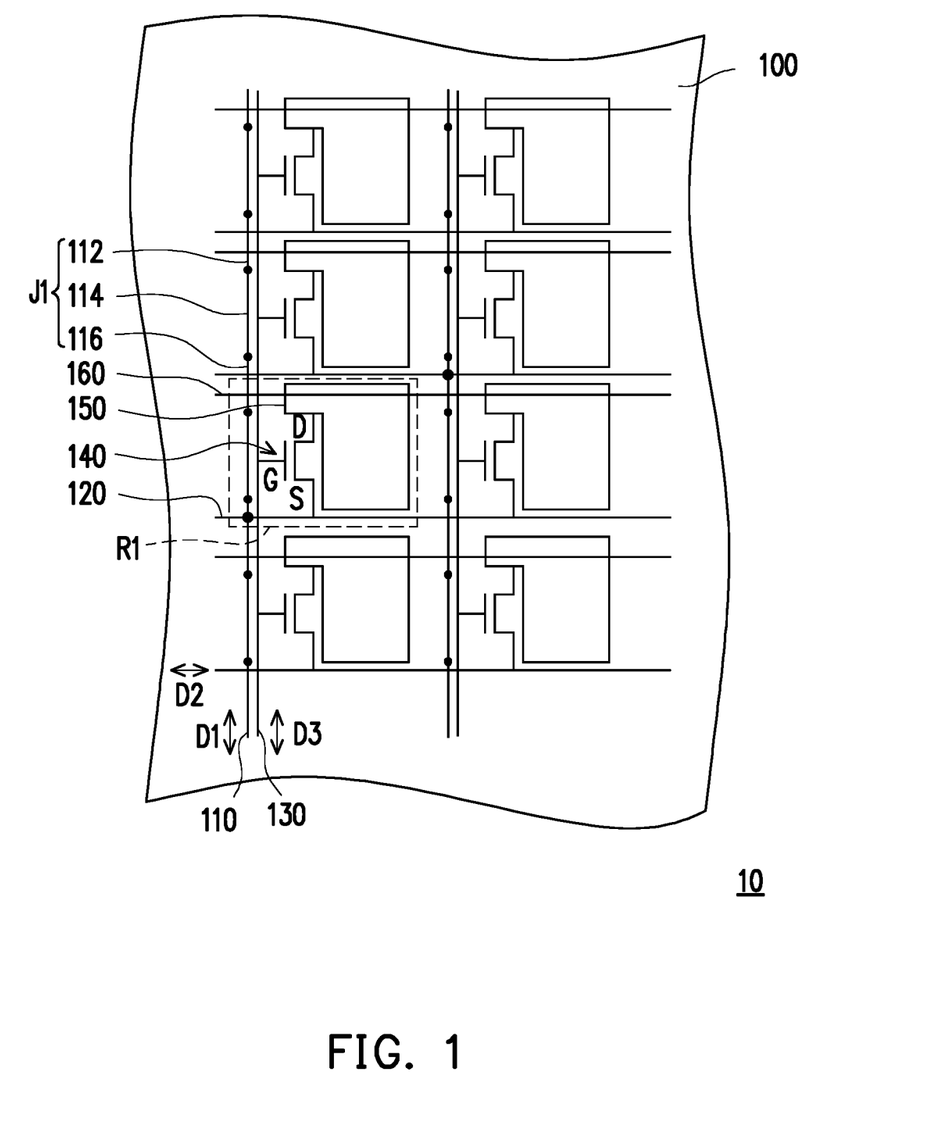
FIG. 1 is a schematic top view of a pixel array substrate according to an embodiment of the invention.

FIG. 1 is a schematic top view of a pixel array substrate according to an embodiment of the invention. Referring to FIG. 1, a pixel array substrate 10 includes a substrate 100, a plurality of first signal lines 110, a plurality of second signal lines 120, a plurality of third signal lines 130, and a plurality of active devices 140. The first signal lines 110, the second signal lines 120, the third signal lines 130, and the active devices 140 are all disposed on the substrate 100 to constitute the pixel array substrate 10. An extension direction D1 of the first signal lines 110 and an extension direction D3 of the third signal lines 130 extend substantially in a vertical direction of the figure while an extension direction D2 of the second signal lines 120 extends substantially in a horizontal direction of the figure. Thus, the second signal lines 120 intersect the first signal lines 110 and the third signal lines 130, and the extension direction D1 may be parallel to the extension direction D3. Each of the active devices 140 may be connected to one of the second signal lines 120 and one of the third signal lines 130. Moreover, the pixel array substrate 10 may further include a plurality of pixel electrodes 150 and a plurality of common electrode lines 160. Each of the pixel electrodes 150 is connected to one of the active devices 140, and the common electrode lines 160 may be disposed across the pixel electrodes 150.

In this embodiment, each of the first signal lines 110 includes a jumper wire bridge structure J1, which includes a first line 112, a second line 114, and a third line 116, for example. The first line 112, the second line 114, and the third line 116 are connected sequentially in the extension direction D1 of the first signal lines 110, and two ends of the second line 114 are electrically connected to the first line 112 and the third line 116 respectively.

More specifically, the second line 114 of the jumper wire bridge structure J1 is located between adjacent two second signal lines 120, and the first line 112 and the third line 116 of the jumper wire bridge structure J1 intersect the adjacent two second signal lines 120 respectively. Meanwhile, a film layer of the second line 114 may be different from a film layer of the third signal line 130. Thus, even though the second line 114 and the third signal line 130 are adjacent to each other, since they are manufactured on different film layers, the possibility of the occurrence of short circuit between the two lines is reduced to improve the yield rate of the pixel array substrate 10. For example, in the case where the substrate 100 is a plastic substrate, the plastic substrate may contain impurities or have a foreign matter attached thereto, and if the adjacent lines are manufactured on the same film layer, the impurities or the foreign matter may easily cause short circuit between the adjacent lines. The design of the jumper wire bridge structure J1 of this embodiment is conducive to preventing from the situation described above, so as to improve the yield rate of the pixel array substrate 10.

Each of the second signal lines 120 may be electrically connected to one of the first signal lines 110, and the second signal lines 120 may be connected to different first signal lines 110 respectively. A driving circuit (not shown) of the pixel array substrate 10 may input a corresponding signal to the first signal line 110, and the first signal line 110 may transmit the received signal to the corresponding second signal line 120. Thus, signal transmission of the second signal line 120 is basically achieved by the circuit inside the pixel array substrate 10 without using the area of a side frame region of the pixel array substrate 10. Therefore, the design of a narrow side frame may be achieved.

Each of the active devices 140 may be a three-terminals device, which includes a gate G, a source S, and a drain D. The gate G is connected to one of the third signal lines 130, the source S is connected to one of the second signal lines 120, and the drain D is connected to one of the pixel electrodes 150. That is, the third signal line 130 may be deemed as a gate line or a scan line, and the second signal line 120 may be deemed as a data line, but the invention is not limited thereto. In other embodiments, the gate G may be connected to one of the second signal lines 120, and the source S may be connected to one of the third signal lines 120, such that the second signal line 120 may be deemed as a gate line or a scan line and the third signal line 130 may be deemed as a data line.

Figure 2:
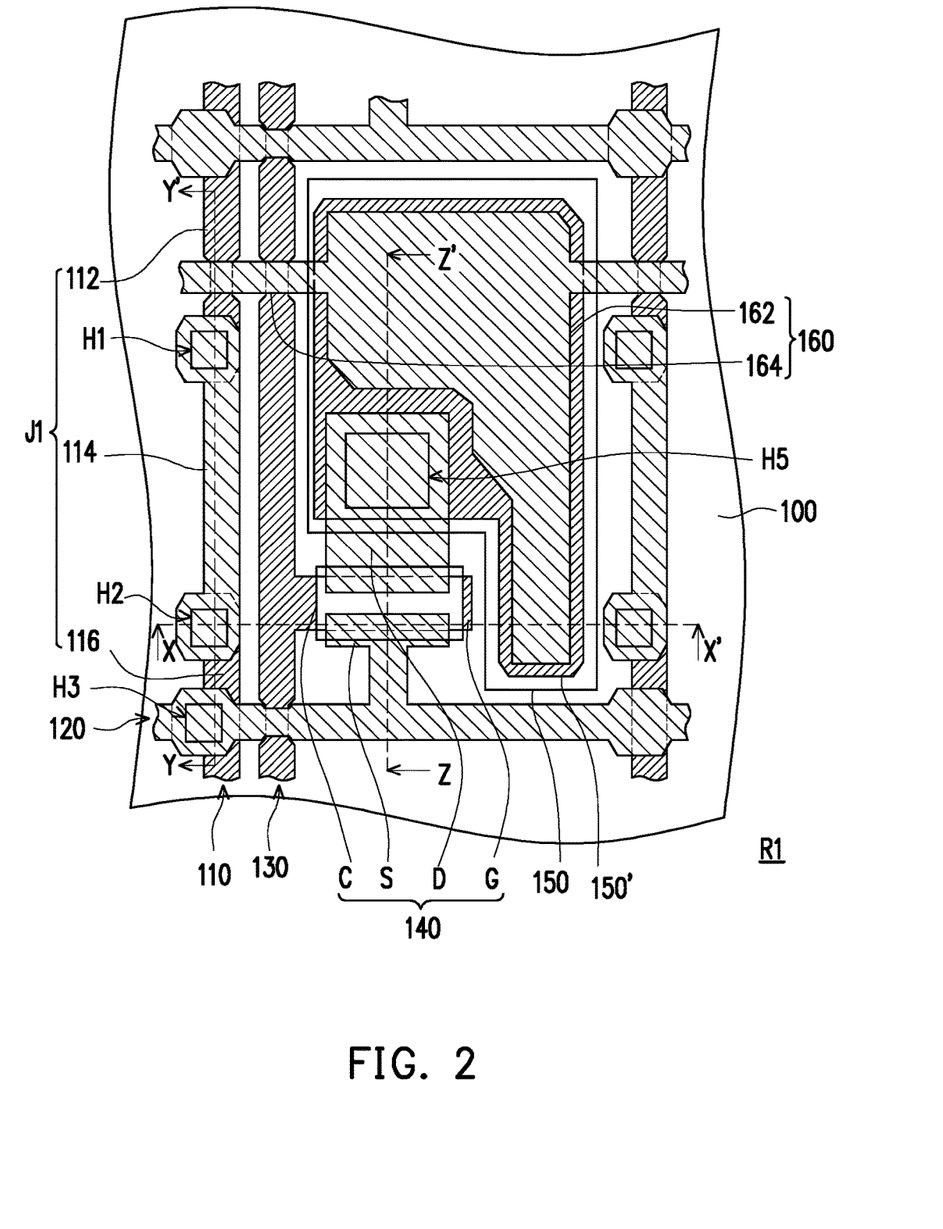
FIG. 2 is a schematic view of a region R1 of the pixel array substrate of FIG. 1.

FIG. 2 is a schematic view of an embodiment of a region R1 of the pixel array substrate of FIG. 1. Referring to FIG. 1 and FIG. 2, the region R1 substantially shows the layout design of a single pixel structure, but it should be noted that the pixel structure layout design presented by FIG. 2 is merely an example and should not be construed as a limitation to the invention. In the region R1, the active device 140 may be a thin film transistor, and in addition to the gate G, the source S, and the drain D, the active device 140 further includes a channel layer C, which is manufactured by using a semiconductor material for controlling the electrical characteristics of the active device 140. The common electrode line 160 includes a common electrode 162 and a common electrode connection line 164 connecting the common electrode 162. More specifically, the common electrode 162 may be a widened portion of the common electrode line 160 and the area of each common electrode 162 correspondingly overlaps the area of one pixel electrode 150. The common electrode connection line 164 may connect the common electrodes 162 in series and each common electrode connection line 164 intersects the first line 112 of at least one first signal line 110. Moreover, the pixel array substrate 10 may be provided with an auxiliary electrode 150' corresponding to each pixel electrode 150, and the auxiliary electrode 150' may be electrically connected to the drain D. The area of the pixel electrode 150 and the area of the auxiliary electrode 150' both overlap the area of the common electrode 162, so as to constitute a storage capacitor.

Figure 3A:
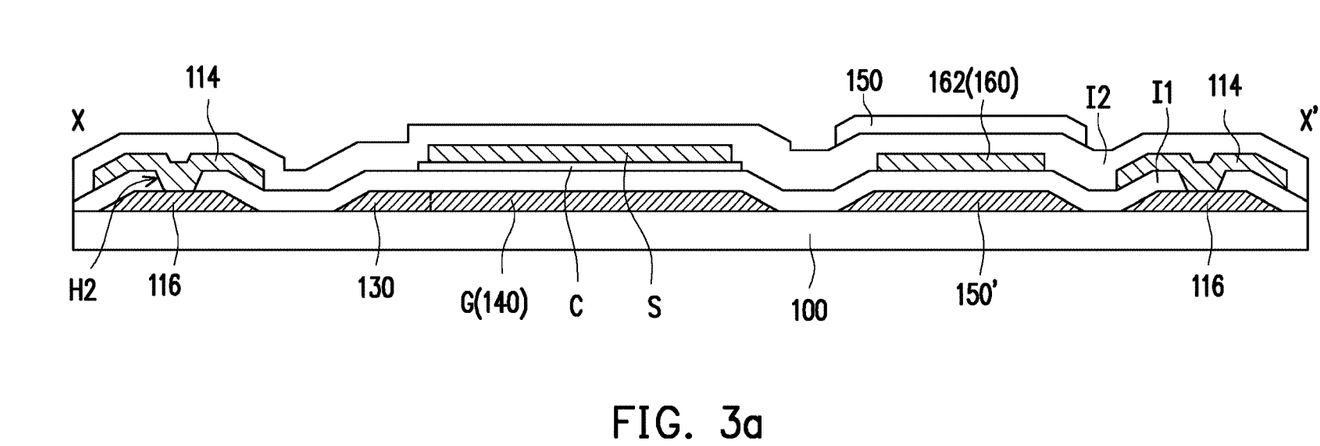
FIG. 3a is a schematic cross-sectional view of FIG. 2 along the line X-X'.
Figure 3B:
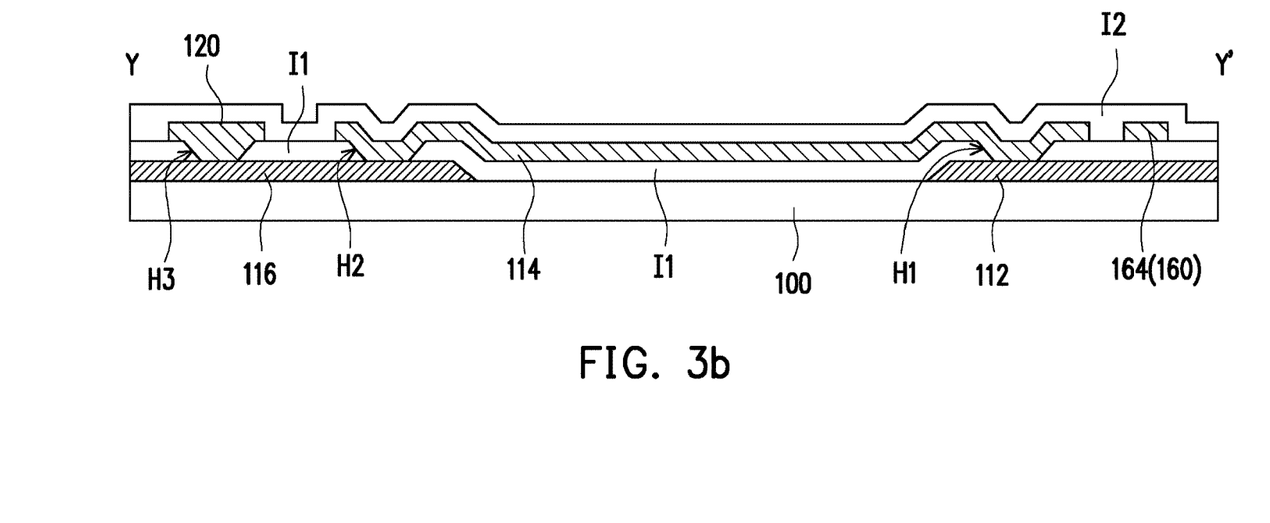
FIG. 3b is a schematic cross-sectional view of FIG. 2 along the line Y-Y'.
Figure 3C:
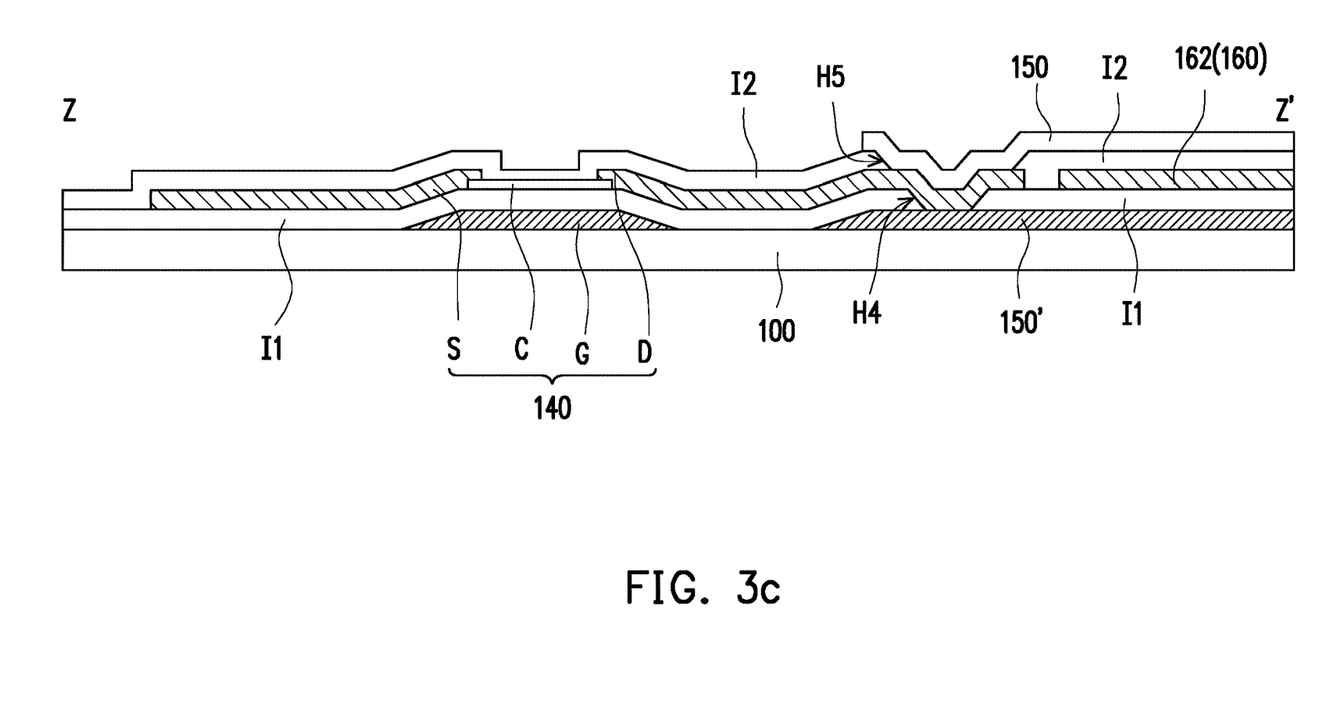
FIG. 3c is a schematic cross-sectional view of FIG. 2 along the line Z-Z'.

FIG. 3a is a schematic cross-sectional view of FIG. 2 along the line X-X', FIG. 3b is a schematic cross-sectional view of FIG. 2 along the line Y-Y', and FIG. 3c is a schematic cross-sectional view of FIG. 2 along the line Z-Z'.

It is known from FIG. 2 with reference to FIG. 3a to FIG. 3b that the pixel array substrate 10 may be composed of a plurality of film layers stacked on the substrate 100. That is, a method of manufacturing each component of the pixel array substrate 10 may include: first forming an entire material layer with use of a required material on the substrate 100, and then patterning the material layer according to a desired pattern of each component to complete the required component. A method of forming the entire material layer may be a deposition method, a coating method, and so on. A method of patterning the material layer may include a photolithography and etching method, a laser method, and so on. In other embodiments, each component may be manufactured by a printing method.

More specifically, the first line 112 and the third line 116 of the first signal line 110, the third signal line 130, the gate G of the active device 140, and the auxiliary electrode 150' are constituted by the same film layer (e.g., a M1 conductive layer) close to the substrate 100. An insulating layer I1 is disposed on the first line 112 and the third line 116 of the first signal line 110, the third signal line 130, the gate G of the active device 140, and the auxiliary electrode 150'. The channel layer C of the active device 140 is disposed on the insulating layer I1. The second line 114 of the first signal line 110, the source S and the drain D of the active device 140, and the common electrode line 160 are constituted by another film layer (e.g., a M2 conductive layer) different from the M1 conductive layer and are disposed on the insulating layer I1 and the channel layer C, wherein the source S and the drain D of the active device 140 are in contact with the channel layer C respectively, but the source S and the drain D of the active device 140 are not directly connected to each other. An insulating layer I2 is disposed on the channel layer C of the active device 140, the second line 114 of the first signal line 110, the source S and the drain D of the active device 140, the second signal line 120, and the common electrode line 160. The pixel electrode 150 is disposed on the insulating layer I2 and is manufactured by using another conductive film layer that is different from the M1 conductive layer and the M2 conductive layer. For this embodiment, the M1 conductive layer is located between the M2 conductive layer and the substrate 100, but the order in which the M1 conductive layer and the M2 conductive layer are stacked may be reverse. In addition, the M1 conductive layer and the M2 conductive layer may be formed of the same or different materials, which specifically include a metal, an alloy of a metal material, an organic conductive material, a conductive oxide, or a combination thereof, wherein the metal is a metal material that is solid and stable at room temperature and has a required electrical conductivity, such as aluminum, molybdenum, and copper, for example, but not limited thereto.

It is known from FIG. 3a and FIG. 3b that the first line 112 and the third line 116 of the first signal line 110 are located on the same film layer while the second line 114 is located on another film layer. The insulating layer I1 is disposed between the film layer of the first line 112 and the third line 116 and the film layer of the second line 114. Two ends of the second line 114 of the first signal line 110 are connected to the first line 112 and the third line 116 respectively via a first contact window H1 and a second contact window H2. The first contact window H1 and the second contact window H2 may be deemed as structures that penetrate the insulating layer I1 for the second line 114 of the first signal line 110 to be in contact with the first line 112 and the third line 116.

Furthermore, the second signal line 120 may be formed by the same film layer as the second line 114 of the first signal line 110 and may be connected to the third line 116 of the first signal line 110 via a third contact window H3. Thus, even though the second line 114 of the first signal line 110 is adjacent to the third signal line 130, they are located on different film layers and are unlikely to cause undesirable short circuit. In addition, in the case where the M1 conductive layer and the M2 conductive layer are formed of the same material, the first line 112, the second line 114, and the third line 116 may be formed of the same material, so as to reduce a contact impedance among the first line 112, the second line 114, and the third line 116. In other words, the first signal line 110 has the jumper wire bridge structure J1, which not only reduces the possibility of the occurrence of undesirable short circuit between the lines but also maintains favorable signal transmission quality, and the jumper wire bridge structure J1 does not cause an excessive load on the lines.

In FIG. 3c, the auxiliary electrode 150', the common electrode 162, and the pixel electrode 150 are stacked sequentially from bottom to top on the substrate 100. In this embodiment, the drain D of the active device 140 may be connected to the auxiliary electrode 150' via a fourth contact window H4 that penetrates the insulating layer I1, and the pixel electrode 150 may be connected to the drain D of the active device 140 via a fifth contact window H5 that penetrates the insulating layer I2. Thus, the pixel electrode 150 and the auxiliary electrode 150' may have the same voltage and hold the common electrode 162 therebetween, so as to form a storage capacitor. Nevertheless, in other embodiments, the auxiliary electrode 150' may be omitted.

Figure 4:
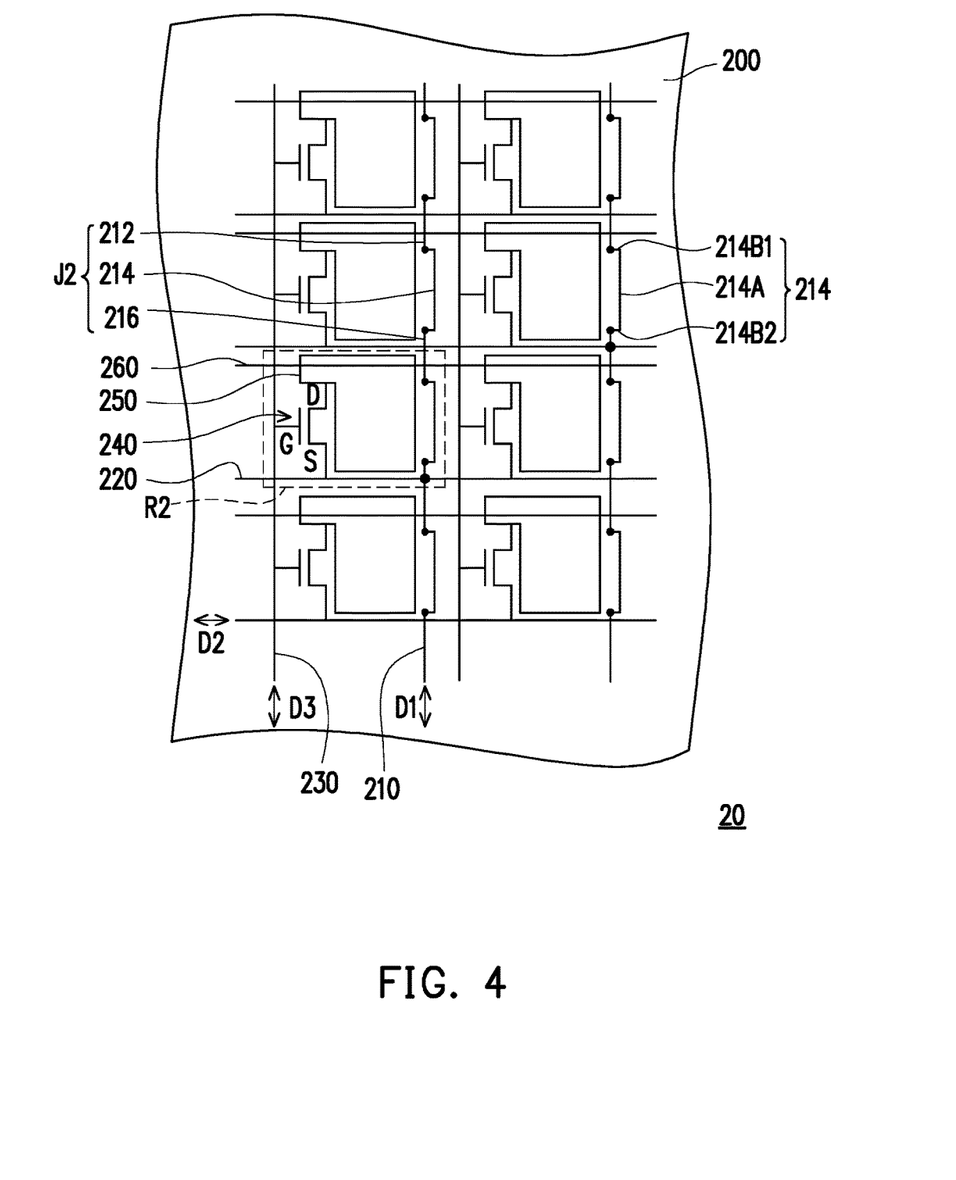
FIG. 4 is a schematic top view of a pixel array substrate according to an embodiment of the invention.
Figure 5:
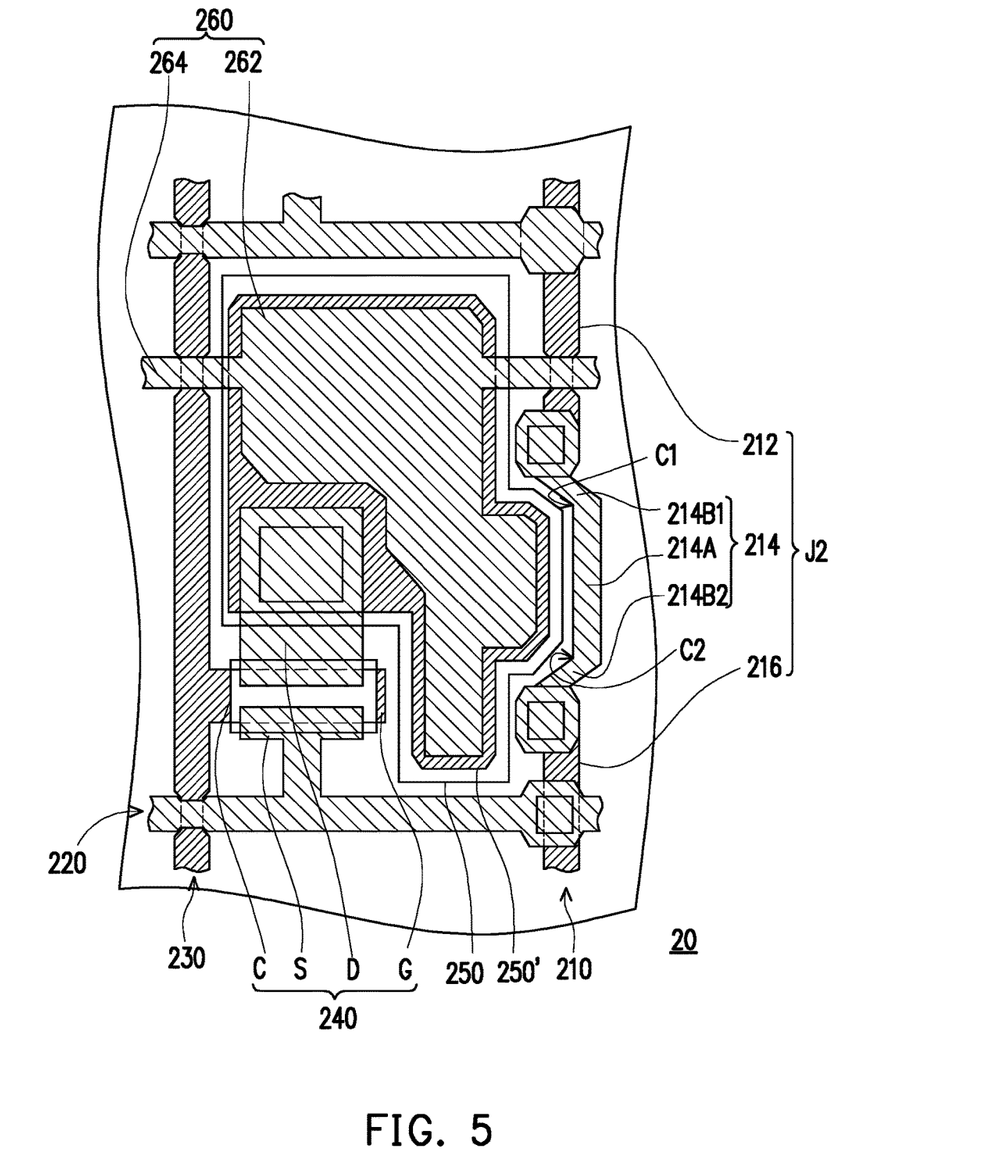
FIG. 5 is a schematic view of a region R2 of the pixel array substrate of FIG. 4.

FIG. 4 is a schematic partial top view of a pixel array substrate according to another embodiment of the invention, and FIG. 5 is a schematic view of a region R2 of the pixel array substrate of FIG. 4. Referring to FIG. 4 and FIG. 5, a pixel array substrate 20 includes a substrate 200 and a plurality of first signal lines 210, a plurality of second signal lines 220, a plurality of third signal lines 230, a plurality of active devices 240, a plurality of pixel electrodes 250, and a plurality of common electrode lines 260 disposed on the substrate 200. The first signal lines 210 and the third signal lines 230 are disposed substantially in parallel to each other. The second signal lines 220 intersect the first signal lines 210 and the third signal lines 230, and each of the second signal lines 220 is electrically connected to one of the first signal lines 210. Each of the active devices 240 is electrically connected to one of the second signal lines 220, one of the third signal lines 230, and one of the pixel electrodes 250. The common electrode line 260 is disposed across the pixel electrodes 250. In this embodiment, the connection relationship among the first signal lines 210, the second signal lines 220, the third signal lines 230, the active devices 240, the pixel electrodes 250, the auxiliary electrodes 250', and the common electrode lines 260 is substantially similar to the connection relationship among the first signal lines 110, the second signal lines 120, the third signal lines 130, the active devices 140, the pixel electrodes 150, the auxiliary electrodes 150', and the common electrode line 160 of the previous embodiment, and thus is not repeated hereinafter.

It is known from FIG. 5 that the common electrode line 260 includes a common electrode 262, which has an area overlapping the pixel electrode 250, and a common electrode connection line 264 connecting the common electrodes 262 in series. In addition, the pixel array substrate 20 further includes the auxiliary electrode 250' having an area overlapping the pixel electrode 250. Thus, the auxiliary electrode 250', the common electrode 262, and the pixel electrode 250 are stacked sequentially on the substrate 200 to constitute a storage capacitor.

The active device 240 may be a thin film transistor, which includes a gate G, a channel layer C, a source S, and a drain D. For this embodiment, the gate G is connected to one of the third signal lines 230, the source S is connected to one of the second signal lines 220, and the drain D is connected to one of the pixel electrodes 250. In other embodiments, the gate G may be connected to one of the second signal lines 220 and the source S may be connected to one of the third signal lines 230. Each of the second signal lines 220 may be electrically connected to one of the first signal lines 210, and the number of the first signal lines 210 is not smaller than the number of the second signal lines 220, such that the second signal lines 220 may be connected to different first signal lines 210 respectively.

Moreover, each of the first signal lines 210 includes a jumper wire bridge structure J2, which includes a first line 212, a second line 214, and a third line 216, for example. The first line 212, the second line 214, and the third line 216 are connected sequentially in the extension direction D1 of the first signal lines 210, and two ends of the second line 214 are electrically connected to the first line 212 and the third line 216 respectively. In this embodiment, how the first line 212, the second line 214, and the third line 216 are stacked and connected may be understood by referring to the first line 112, the second line 114, and the third line 116 of FIG. 3a to FIG. 3b and thus is not repeated hereinafter.

In this embodiment, the first signal line 210 and one of the third signal lines 230 are located on two opposite sides of one of the pixel electrodes 250, and the second line 214 of the first signal line 210 is a bent line. The second line 214 may include a central portion 214A and two end portions 214B1 and 214B2, and the central portion 214A is located between the end portion 214B1 and the end portion 214B2. The central portion 214A is farther away from the corresponding one of the third signal lines 230 with respect to the two end portions 214B1 and 214B2. That is, a distance between the central portion 214A and the third signal line 230 is greater than a distance between each of the two end portions 214B1 and 214B2 and the third signal line 230. Nevertheless, in other embodiments, the distance between the central portion 214A and the third signal line 230 or the distance between each of the two end portions 214B1 and 214B2 and the third signal line 230 may be adjusted according to the requirements of the designer. That is, the distance between the central portion 214A and the third signal line 230 may be different from the distance between each of the two end portions 214B1 and 214B2 and the third signal line 230. The central portion 214A and the end portion 214B1 may have an angle C1 therebetween, and the central portion 214A and the end portion 214B2 may form an angle C2 therebetween. Nevertheless, in other embodiments, the second line 214 may be a curved line.

In the design where the second line 214 has a bent shape, the contours of the pixel electrode 250, the auxiliary electrode 250', and the common electrode 262 may be arranged conforming or corresponding to the shape of the second line 214. That is, the respective edges of the pixel electrode 250, the auxiliary electrode 250', and the common electrode 262, which are adjacent to the first signal line 210, are not necessarily parallel to the extension direction D1 of the first signal line 210. Referring to FIG. 5, the respective areas of the pixel electrode 250, the auxiliary electrode 250', and the common electrode 262 may protrude in a direction away from the third signal line 230 to conform to the bending of the second line 214. Thus, the layout areas of the pixel electrode 250, the auxiliary electrode 250', and the common electrode 262 are more flexible. For example, the areas of the pixel electrode 250, the auxiliary electrode 250', and the common electrode 262 may have protruding patterns corresponding to the bending shape of the second line 214, as shown in FIG. 5, to increase the storage capacitor. Nevertheless, the respective edges of the pixel electrode 250, the auxiliary electrode 250', and the common electrode 262, which are adjacent to the first signal line 210, may be selectively parallel to the extension direction D1 of the first signal line 210, so as to form a relatively square pixel structure. The designer may determine the designs on patterns and areas of the pixel electrode 250, the auxiliary electrode 250', and the common electrode 262 according to different requirements.

In the embodiments described above, the jumper wire bridge structures J1 and J2 are disposed on the first signal lines 110 and 210, for example, but the invention is not limited thereto. In other embodiments, the jumper wire bridge structures J1 and J2 may also be disposed on the third signal lines 130 and 230 instead, while the first signal lines 110 and 210 do not have the jumper wire bridge structures J1 and J2. Moreover, in some embodiments, when the number of the first signal lines 110 or 210 is greater than the number of the third signal lines 130 or 230, two or more first signal lines 110 or 210 may be disposed beside each of the third signal lines 130 or 230. In that case, some of the first signal lines may have the structure design of the first signal lines 110 of FIG. 2 while some other first signal lines may have the structure design of the first signal lines 210 of FIG. 5.

Figure 6:
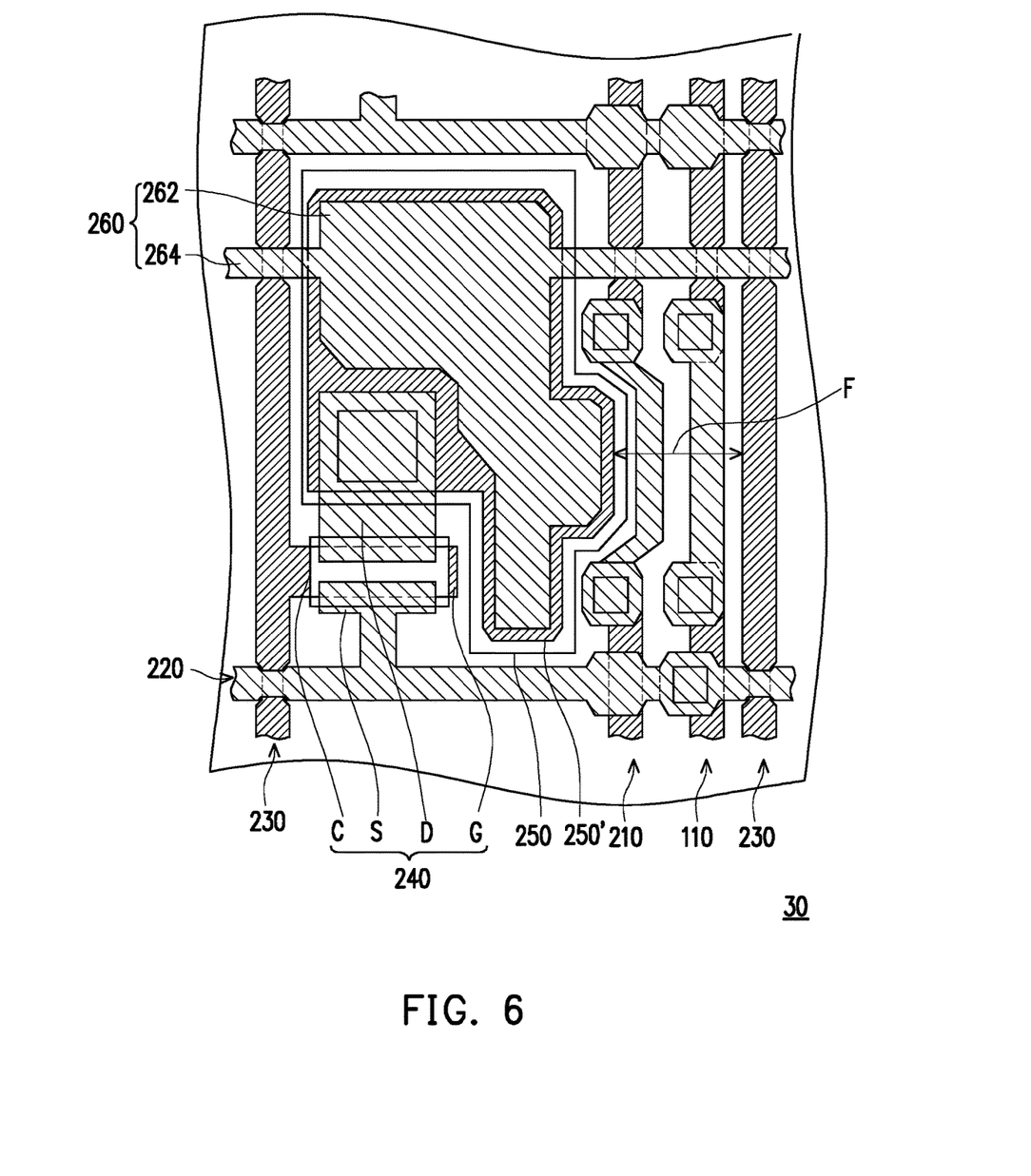
FIG. 6 is a schematic view of a partial region of a pixel array substrate.

For example, FIG. 6 is a schematic view of a partial region of a pixel array substrate. Referring to FIG. 6, a pixel array substrate 30 is substantially similar to the pixel array substrate 20 of FIG. 5. Thus, identical components in the two embodiments are represented by the same reference numerals, and the components represented by the same reference numerals have the configuration relationship, functions, and features as described with reference to FIG. 5 and therefore details are not repeated hereinafter. Nevertheless, in addition to the first signal lines 210, the second signal lines 220, the third signal lines 230, the active devices 240, the pixel electrodes 250, the common electrodes 262, and the auxiliary electrodes 250', the pixel array substrate 30 further includes the first signal lines 110.

More specifically, two first signal lines, which are the first signal line 110 and the first signal line 210, are disposed between adjacent two third signal lines 230. The first signal line 110 and the first signal line 210 are located between the pixel electrode 250 and one of the third signal lines 230, wherein the first signal line 110 is located between this third signal line 230 and the first signal line 210, and the first signal line 210 is located between the first signal line 110 and the pixel electrode 250. The first signal line 210 has a bent jumper wire bridge structure while the first signal line 110 has a straight jumper wire bridge structure, and the first signal line 210 may be closer to the pixel electrode 250 with respect to the first signal line 110. Since the first signal line 110 and the first signal line 210 both have the jumper wire bridge structures, the distance between the components manufactured on the same film layer may be increased to prevent the occurrence of undesirable short circuit. For example, a distance F between the third signal line 230 and the auxiliary electrode 250' on the same film layer at locations corresponding to the jumper wire bridge structures of the first signal line 110 and the first signal line 210 is increased significantly. In the case of a pixel array substrate having a display screen of 10.3 inches, a resolution of 1404×1872, and a pixel size of 112 μm×112 μm, for example, the distance F may reach about 27 μm without causing undesirable short circuit.

To sum up, the pixel array substrate of the embodiments of the invention includes the first signal line that has the jumper wire bridge structure, wherein the jumper wire bridge structure includes the first line, the second line, and the third line that are connected to one another sequentially, and the film layer of the first line and the third line is different from the film layer of the second line. Thus, the pixel array substrate of the embodiments of the invention is conducive to reducing the possibility of generating an unnecessary short circuit between the lines on the same layer. Moreover, the contour and area of the pixel electrode may be adjusted to conform to the jumper wire bridge structure, which is relatively flexible.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A pixel array substrate, comprising:
   a substrate;
   a plurality of first signal lines disposed on the substrate, wherein each of the first signal lines comprises a jumper wire bridge structure which comprises a first line, a second line, and a third line, wherein two ends of the second line are connected to the first line and the third line respectively, and a film layer of the first line and the third line is different from a film layer of the second line;
   a plurality of second signal lines disposed on the substrate and electrically connected to different first signal lines respectively, wherein the second line is located between adjacent two second signal lines, and the first line and the third line intersect the adjacent two second signal lines;
   a plurality of third signal lines disposed on the substrate and intersecting the second signal lines; and
   a plurality of active devices disposed on the substrate, wherein each of the active devices is connected to one of the second signal lines and one of the third signal lines.

2. The pixel array substrate according to claim 1, wherein the film layer of the first line and the third line is the same as a film layer of the third signal lines.

3. The pixel array substrate according to claim 1, wherein the film layer of the second line is the same as a film layer of the second signal lines.

4. The pixel array substrate according to claim 1, further comprising an insulating layer disposed between the film layer of the first line and the third line and the film layer of the second line, and the two ends of the second line are connected to the first line and the third line respectively via a first contact window and a second contact window that penetrate the insulating layer.

5. The pixel array substrate according to claim 1, further comprising a plurality of pixel electrodes, wherein each of the active devices comprises a gate and a source/drain, wherein one of the gate and the source/drain is connected to one of the second signal lines and the other one of the gate and the source/drain is connected to one of the third signal lines, and each of the active devices is electrically connected to one of the pixel electrodes.

6. The pixel array substrate according to claim 5, wherein one of the third signal lines and one of the first signal lines are located on two sides of one of the pixel electrodes respectively.

7. The pixel array substrate according to claim 6, wherein the second line of the one of the first signal lines comprises a central portion and two end portions located at two ends of the central portion, and a distance between the central portion and the one of the third signal lines is different from a distance between the two end portions and the one of the third signal lines.

8. The pixel array substrate according to claim 5, wherein the one of the third signal lines is located between the one of the first signal lines and the one of the pixel electrodes.

9. The pixel array substrate according to claim 1, wherein the film layer of the first line and the third line is located between the film layer of the second line and the substrate.

10. The pixel array substrate according to claim 1, wherein the first line, the second line, and the third line comprise a same material.

* * * * *